(12) United States Patent
Nezuka (10) Patent No.: US 7,940,135 B2
(45) Date of Patent: May 10, 2011

(54) OSCILLATION CIRCUIT (75) Inventor: Tomohiro Nezuka, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 186 days.

(21) Appl. No.: 12/304,032

(22) PCT Filed: Jun. 7, 2007

(86) PCT No.: PCT/JP2007/061561
§ 371 (c)(1),
(2), (4) Date: Feb. 4, 2009

(87) PCT Pub. No.: WO2007/142301
PCT Pub. Date: Dec. 13, 2007

(65) Prior Publication Data
US 2010/0007428 A1    Jan. 14, 2010

(30) Foreign Application Priority Data

Jun. 9, 2006   (JP) ................................ P2006-161358

(51) Int. Cl.
*H03K 3/26* (2006.01)
(52) U.S. Cl. ........ 331/111; 331/143; 331/145; 331/183; 327/131; 327/172
(58) Field of Classification Search .................. 331/111, 331/143, 145, 183; 327/172
See application file for complete search history.

(56) References Cited

U.S. PATENT DOCUMENTS 5,703,473 A * 12/1997 Phillips et al. ................ 323/282
7,015,764 B2 * 3/2006 Starr et al. ..................... 331/78

FOREIGN PATENT DOCUMENTS

| JP | 05-160690 A | 6/1993 |
| JP | 10-233657 A | 9/1998 |
| JP | 2002-043898 A | 2/2002 |
| JP | 2002-217687 A | 8/2002 |
| JP | 2004-072657 A | 3/2004 |

\* cited by examiner

*Primary Examiner* — Arnold Kinkead
(74) *Attorney, Agent, or Firm* — Sughrue Mion, PLLC (57) ABSTRACT

This oscillation circuit includes a triangular wave generation circuit that generates a triangular wave signal corresponding to an outputted clock signal, a comparison circuit that generates a clock signal corresponding to a comparison of the triangular wave signal with a first reference voltage and a second reference voltage, a current adjusting circuit that adjusts the value of adjusted current according to the power supply voltage for the comparison circuit, and a reference voltage generation circuit that generates the first reference voltage and the second reference voltage having a voltage differential that corresponds to the value of the adjusted current. The current adjusting circuit increases the adjusted current when the power supply voltage for the comparison circuit rises, and reduces the adjusted current when the power supply voltage drops. The reference voltage generation circuit increases the voltage differential between the first reference voltage and the second reference voltage when the adjusted current increases, and reduces the voltage differential when the adjusted current decreases.

7 Claims, 10 Drawing Sheets

OSCILLATION CIRCUIT

TECHNICAL FIELD

This invention relates to an oscillation circuit.

BACKGROUND ART

Oscillation circuits that generate a clock signal with a rectangular waveform are known. The oscillation circuit discussed in Patent Document 1 generates a triangular wave signal by alternately switching the charging and discharging operations of a capacitor, and generates a clock signal on the basis of a comparison between the voltage of the triangular wave signal and two reference voltages by a comparator. With this oscillation circuit, the switching of the charging and discharging operations of the capacitor is performed according to the voltage of the clock signal outputted from the comparator.

Patent Document 1: Japanese Patent Application Laid-Open H10-233657

DISCLOSURE OF THE INVENTION

Problems to be Solved by the Invention

With the oscillation circuit discussed in Patent Document 1, the frequency of a clock signal is determined by feedback loop processing including a capacitor and a comparator, so that the period of the clock signal, the repeat period of a triangular wave signal, and the charge and discharge repeat period of the capacitor coincide. In general, the response lag time of a logic circuit depends on the power supply voltage, so the response lag time of the comparator in Patent Document 1 ends up fluctuating along with fluctuations in the power supply voltage. As a result, feedback loop processing including a capacitor causes the frequency of the clock signal to fluctuate.

In view of this, it is an object of the present invention to provide an oscillation circuit with which fluctuation of the clock signal frequency attributable to fluctuation in the power supply voltage can be reduced.

Means for Solving the Problem

The oscillation circuit of the present invention generates a clock signal with a triangular waveform. This oscillation circuit comprises (a) a triangular wave generation circuit that includes a capacitor, switches the charging or discharging state of the capacitor according to the voltage value of the clock signal, and generates a triangular wave signal, (b) a comparison circuit that receives the triangular wave signal outputted from the triangular wave generation circuit, receives a first reference voltage and a second reference voltage, and generates a clock signal having a voltage value that corresponds to a comparison of the voltage value of the triangular wave signal with the value of the first reference voltage, and to a comparison of the voltage value of the triangular wave signal with the value of the second reference voltage, (c) a current adjusting circuit that is connected to a reference current source outputting a reference current, is connected to a power supply for the comparison circuit, and generates an adjusted current in which the value of the reference current has been changed according to the change in voltage of the power supply, (d) and a reference voltage generation circuit that generates the first reference voltage and the second reference voltage having a voltage differential that corresponds to the value of the adjusted current outputted from the current adjusting circuit. (e) The current adjusting circuit increases the adjusted current when the voltage of the power supply for the comparison circuit rises, and reduces the adjusted current when the voltage of the power supply drops. (f) The reference voltage generation circuit increases the voltage differential between the first reference voltage and the second reference voltage when the adjusted current increases, and reduces the voltage differential between the first reference voltage and the second reference voltage when the adjusted current decreases.

In general, the response lag time of a logic circuit is shorter the higher is the power supply voltage, so the response lag time of the comparison circuit ends up being shorter the higher is the power supply voltage. Nevertheless, with this oscillation circuit, if the power supply voltage of the comparison circuit rises, the value of the adjusted current is increased by the current adjusting circuit, and the voltage differential between the first reference voltage and the second reference voltage is increased by the reference voltage generation circuit, so the charging time and discharging time between the first reference voltage and second reference voltage in the capacitor are longer. On the other hand, if the power supply voltage of the comparison circuit drops, the value of the adjusted current is reduced by the current adjusting circuit, and the voltage differential between the first reference voltage and the second reference voltage is decreased by the reference voltage generation circuit, so the charging time and discharging time between the first reference voltage and second reference voltage in the capacitor are shorter.

Therefore, with this oscillation circuit, even if fluctuation of the power supply voltage should cause fluctuation in the response lag time of the comparison circuit, the charging time and discharging time of the capacitor are changed so as to cancel out this change in the response lag time of the comparison circuit. Consequently, fluctuation in the frequency of the clock signal attributable to the power supply voltage dependence of the comparison circuit can be reduced.

Preferably, the above-mentioned current adjusting circuit has a first current mirror circuit to which the reference current is inputted, and a second current mirror circuit to which the output current of the first current mirror circuit is inputted and which receives a supply of voltage from the power supply, and the output current of the second current mirror circuit is outputted as the adjusted current.

Preferably, first current mirror circuit of the current adjusting circuit has (a) a first transistor having a first current terminal connected to the reference current source, a second current terminal connected to one potential of the power supply, and a control terminal connected to the first current terminal, and (b) a second transistor having a control terminal connected to the control terminal of the first transistor, a first current terminal, and a second current terminal connected to one potential of the power supply, and preferably the second current mirror circuit of the current adjusting circuit has (c) a third transistor having a first current terminal connected to the first current terminal of the second transistor, a second current terminal connected to the other potential of the power supply, and a control terminal connected to the first current terminal, and (d) a fourth transistor having a control terminal connected to the control terminal of the third transistor, a first current terminal, and a second current terminal connected to the other potential of the power supply.

With this current adjusting circuit, a first current mirror circuit comprising a first transistor and a second transistor, and a second current mirror circuit comprising a third transistor and a fourth transistor make use of the same power supply as the comparison circuit. If this power supply voltage rises, the voltage between the two current terminals of the second transistor increases. In general, with a transistor, even if the voltage is steady at the control terminal, as the voltage between the two current terminals (Vds or Vce) increases, more current flows to the first current terminal (drain or collector).

Accordingly, if the power supply voltage is high, then even though the reference current supplied from the reference current source, that is, the current flowing to the first transistor, is steady, there is an increase in the current flowing to the second transistor, and there is a corresponding increase in the adjusted current. On the other hand, if the power supply voltage drops, there is a reduction in the current flowing to the second transistor, so the adjusted current decreases.

Preferably, the reference voltage generation circuit has a third current mirror circuit to which the adjusted current is inputted, and a voltage division circuit to which the output current of the third current mirror circuit flows, and the voltage division circuit includes a plurality of resistors connected to each other in series, and generates the first reference voltage and the second reference voltage of which voltage differential is the drop in voltage of at least one of the plurality of resistors.

Preferably, this third current mirror circuit has (e) a fifth transistor having a first current terminal connected to the first current terminal of the fourth transistor, a second current terminal connected to one potential of the power supply, and a control terminal connected to the first current terminal, and (f) a sixth transistor having a control terminal connected to the control terminal of the fifth transistor, a first current terminal, and a second current terminal connected to one potential of the power supply, and (g) preferably the voltage division circuit of the reference voltage generation circuit is connected between the first current terminal of the sixth transistor and the other potential of the power supply.

With this reference voltage generation circuit, since the fifth transistor and the sixth transistor constitute the third current mirror circuit, if the adjusted current increases, more current will flow to the voltage division circuit, there is a greater voltage drop in the resistance within the voltage division circuit, and there is a larger voltage differential between the first reference voltage and the second reference voltage. On the other hand, if the adjusted current decreases, less current will flow to the voltage division circuit, there is less of a voltage drop in the resistance within the voltage division circuit, and there is a smaller voltage differential between the first reference voltage and the second reference voltage.

Effect of the Invention

With the present invention, fluctuation in the frequency of the clock signal attributable to fluctuation of the power supply voltage can be reduced in an oscillation circuit.

LIST OF ELEMENTS 1 oscillation circuit
5 high potential of power supply (other potential)
6 low potential of power supply (one potential)
10 reference current source
20 triangular wave generation circuit
21 first transistor
27 capacitor
30 comparison circuit
40 current adjusting circuit
42 second transistor
43 third transistor
44 fourth transistor
50 reference voltage generation circuit
51 fifth transistor
52 sixth transistor
53 voltage division circuit
54, 55, 56 resistor
CLK, XCLK clock signal
Iref1 reference current
Iref3 adjusted current
Vosc triangular wave signal
Vrefh first reference voltage
Vrefl second reference voltage

BEST MODE FOR CARRYING OUT THE INVENTION

Preferred embodiments of the present invention will now be described in detail through reference to the drawings. Components that are the same or equivalent are numbered the same in the drawings.

Figure 1:
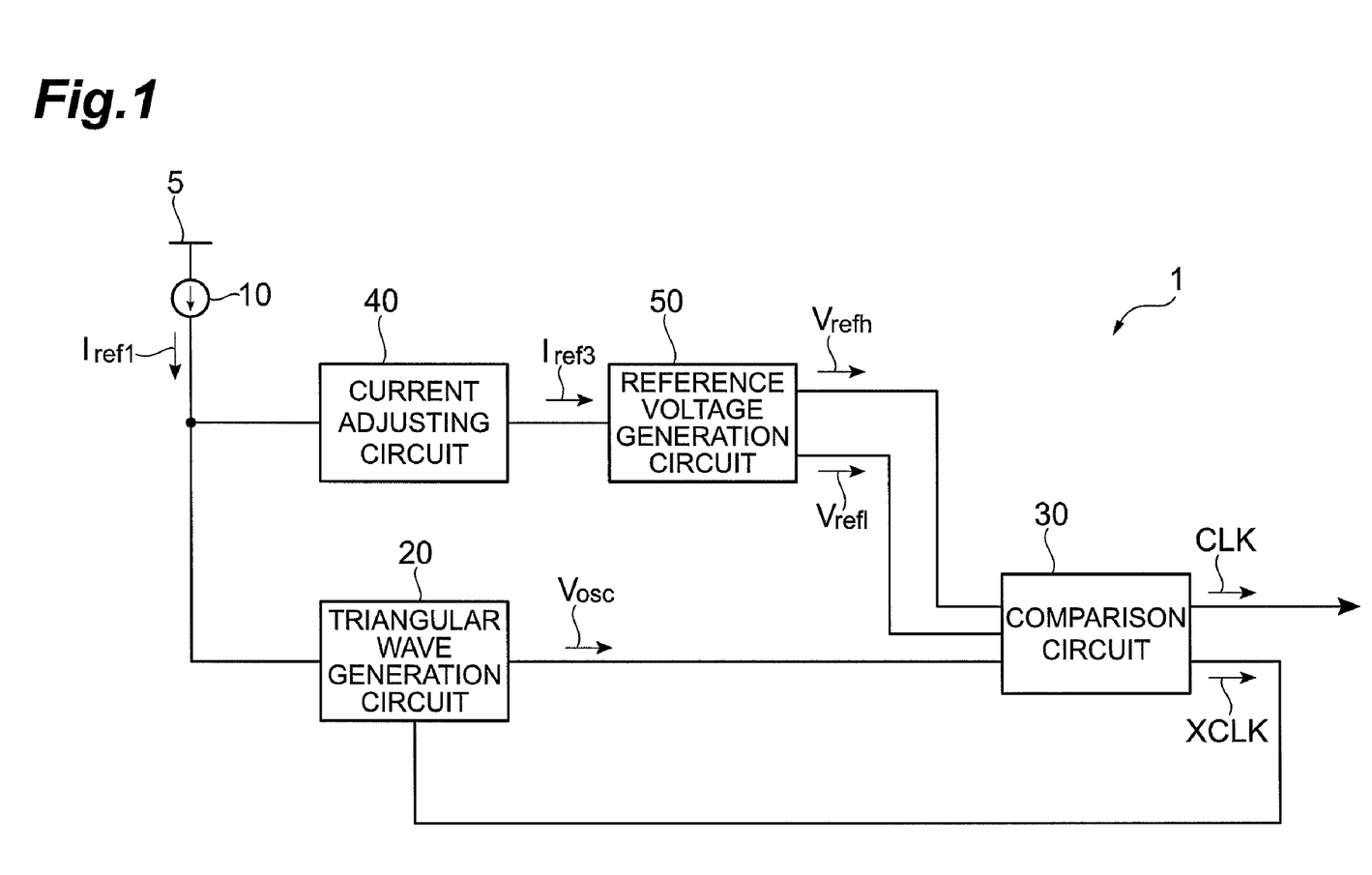
FIG. 1 is a circuit diagram illustrating the oscillation circuit pertaining to an embodiment.

FIG. 1 is a circuit diagram illustrating the oscillation circuit pertaining to an embodiment of the present invention. The oscillation circuit 1 shown in FIG. 1 generates complementary clock signals CLK and XCLK with a rectangular waveform. The oscillation circuit 1 comprises a reference current source 10, a triangular wave generation circuit 20, a comparison circuit 30, a current adjusting circuit 40, and a reference voltage generation circuit 50. In this embodiment, the oscillation circuit 1 is formed within a single integrated circuit, and a single power supply voltage Vdd is supplied to the reference current source 10, the triangular wave generation circuit 20, the comparison circuit 30, the current adjusting circuit 40, and the reference voltage generation circuit 50.

The reference current source 10 is connected to the high potential (the other potential) 5 of the power supply, and generates a reference current Iref1 having a constant voltage value. The reference current source 10 supplies the reference current Iref1 to the triangular wave generation circuit 20 and the current adjusting circuit 40.

The triangular wave generation circuit 20 has a capacitor, uses the reference current Iref1 to charge and discharge this capacitor, and generates a triangular wave signal Vosc. The triangular wave generation circuit 20 receives the clock signal XCLK outputted from the comparison circuit 30, and switches the charging or discharging operation of the capacitor according to the voltage value of this clock signal XCLK. The triangular wave generation circuit 20 outputs the triangular wave signal Vosc to the comparison circuit 30.

A first reference voltage Vrefh and a second reference voltage Vrefl outputted from the reference voltage generation circuit 50 are inputted to the comparison circuit 30. The comparison circuit 30 compares the voltage value of the triangular wave signal Vosc with the value of the first reference voltage Vrefh, compares the voltage value of the triangular wave signal Vosc with the value of the second reference voltage Vrefl, and generates complementary rectangular wave signals of inverted logic according to these comparison results. The comparison circuit 30 outputs these complementary rectangular wave signals as the clock signals CLK and XCLK.

The current adjusting circuit 40 modifies the value of the reference current Iref1 outputted from the reference current source 10 according to the value of the power supply voltage Vdd, and generates an adjusted current Iref3. The current adjusting circuit 40 supplies the adjusted current Iref3 to the reference voltage generation circuit 50.

The reference voltage generation circuit 50 generates the first reference voltage Vrefh and the second reference voltage Vrefl according to the adjusted current Iref3. The voltage differential between the first reference voltage Vrefh and the second reference voltage Vrefl is modified according to the adjusted current Iref3.

Figure 2:
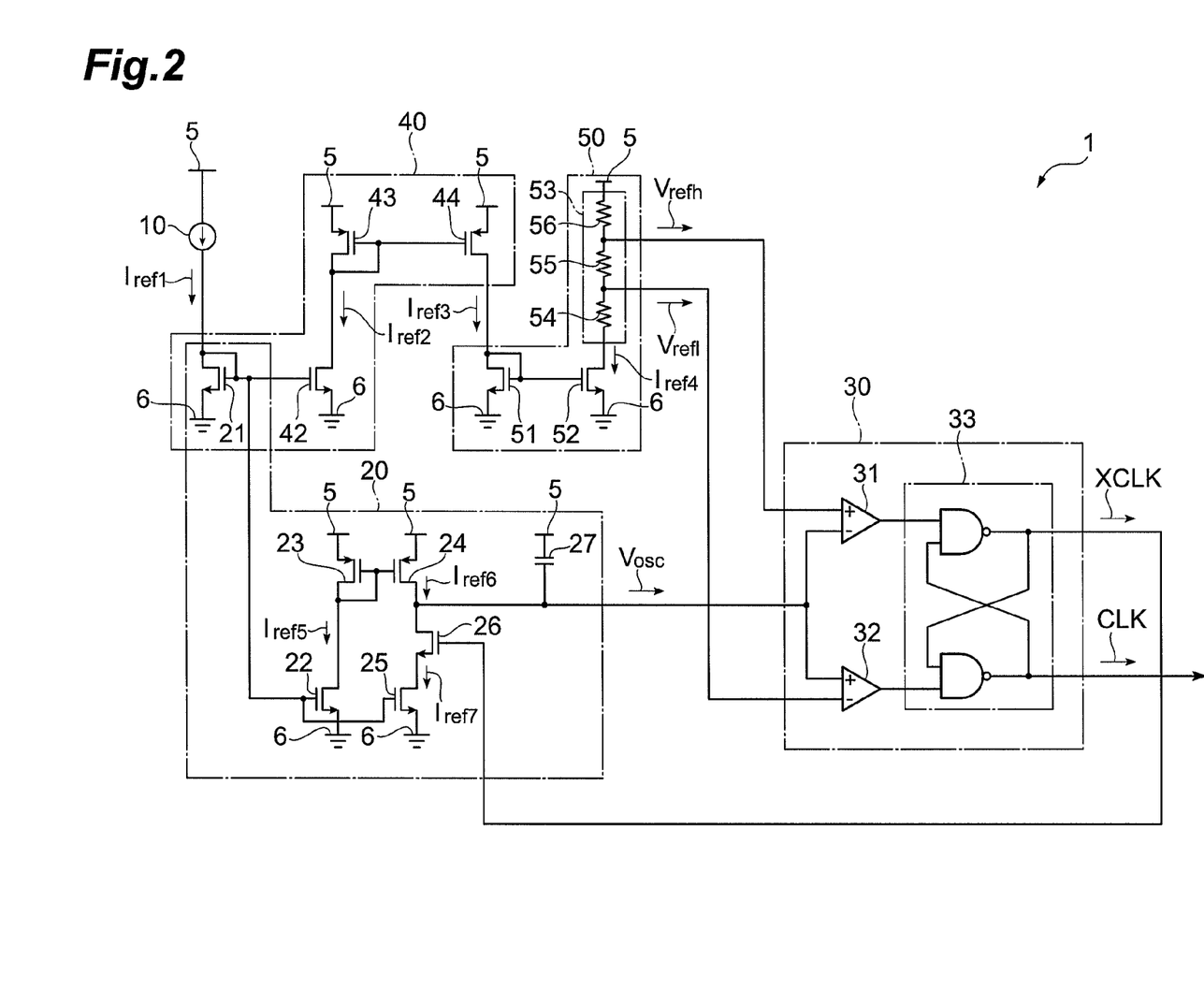
FIG. 2 is a detailed circuit diagram illustrating the oscillation circuit shown in FIG. 1.

FIG. 2 is a detailed circuit diagram of the oscillation circuit shown in FIG. 1. The triangular wave generation circuit 20 has transistors 21, 22, 23, 24, 25, and 26, and a capacitor 27. The transistors 21, 22, 25, and 26 are N-type MOSFETs, while the transistors 23 and 24 are P-type MOSFETs.

The drain of the transistor 21 is connected to the reference current source 10, and the source is connected to the low potential 6 of the power supply (one potential; such as the ground potential). The gate of the transistor 21 is connected to its own drain and to the gate of the transistor 22. The source of the transistor 22 is connected to the low potential 6 of the power supply, and the drain is connected to the drain of the transistor 23. Thus, the transistors 21 and 22 constitute a current mirror circuit, and generate a current Iref5 proportional to the reference current Iref1 between the drain and source of the transistor 22.

The source of the transistor 23 is connected to the high potential 5 of the power supply, and the gate is connected to its own drain and the gate of the transistor 24. The source of the transistor 24 is connected to the high potential 5 of the power supply, and the drain is connected to the drain of the transistor 25 via the transistor 26. Thus, the transistors 23 and 24 constitute a current mirror circuit, and generate a current Iref6 proportional to the current Iref5 between the drain and source of the transistor 24.

The source of the transistor 25 is connected to the low potential 6 of the power supply, and the gate is connected to the gate of the transistor 21. Thus, the transistors 21 and 25 constitute a current mirror circuit, and generate a current Iref7 proportional to the current Iref1 between the drain and source of the transistor 25.

In this embodiment, the gate length and gate width of the transistor 21 and the transistor 22 are the same, the gate length and gate width of the transistor 23 and the transistor 24 are the same, the gate length of the transistor 25 and the transistor 21 is the same, and the gate width of the transistor 25 is twice that of the transistor 21. Therefore, the values of the currents Iref5 and Iref6 are substantially the same as the value of the current Iref1, and the value of the current Iref7 is approximately twice that of the current Iref1.

The transistor 26 is connected between the transistor 24 and the transistor 25. The drain of the transistor 26 is connected to the drain of the transistor 24, and the source is connected to the drain of the transistor 25. The clock signal XCLK from the comparison circuit 30 is inputted to the gate of the transistor 26. The capacitor 27 is connected between the high potential 5 of the power supply and the drain of the transistor 26 and the drain of the transistor 25.

When the transistor 26 is in its on state, the capacitor 27 is charged at a differential current between the current Iref7 and the current Iref6, when the transistor 26 is off, the capacitor 27 is discharged at the current Iref6. The triangular wave signal Vosc is supplied to the comparison circuit 30 by this repeating charging and discharging of the capacitor 27 by the transistor 26.

The comparison circuit 30 has comparators 31 and 32 and an SR-type latch circuit 33. The first reference voltage Vrefh outputted from the reference voltage generation circuit 50 is inputted to the positive input terminal of the comparator 31, while the triangular wave signal Vosc outputted from the triangular wave generation circuit 20 is inputted to the negative input terminal. Meanwhile, the triangular wave signal Vosc outputted from the triangular wave generation circuit 20 is inputted to the positive input terminal of the comparator 32, while the second reference voltage Vrefl outputted from the reference voltage generation circuit 50 is inputted to the negative input terminal.

The comparator 31 outputs a high-level voltage when the voltage value of the triangular wave signal Vosc is smaller than the value of the first reference voltage Vrefh, and outputs a low-level voltage when the voltage value of the triangular wave signal Vosc is larger than the value of the first reference voltage Vrefh. Similarly, the comparator 32 outputs a high-level voltage when the voltage value of the triangular wave signal Vosc is larger than the value of the second reference voltage Vrefl, and outputs a low-level voltage when the voltage value of the triangular wave signal Vosc is smaller than the value of the second reference voltage Vrefl. The output voltage of the comparator 31 and the output voltage of the comparator 32 are each inputted to the SR-type latch circuit 33.

The SR-type latch circuit 33 is made up of two NAND circuits, and generates, for example, complementary clock signals CLK and XCLK, using the output voltage of the comparator 31 and the output voltage of the comparator 32 as a set signal and a reset signal, respectively.

The current adjusting circuit 40 has the first transistor 21, a second transistor 42, a third transistor 43, and a fourth transistor 44. The second transistor 42 is an N-type MOSFET, and the third transistor 43 and the fourth transistor 44 are P-type MOSFETs. The current adjusting circuit 40 shares the first transistor 21 with the triangular wave generation circuit 20.

The gate (control terminal) of the second transistor 42 is connected to the gate (control terminal) of the first transistor 21, and the source (second current terminal) is connected to the low potential 6 of the power supply. The drain (first current terminal) of the second transistor 42 is connected to the drain (first current terminal) of the third transistor 43. Thus, the second transistor 42 constitutes a first current mirror circuit with the first transistor 21, and a current Iref2 that is proportional to the reference current Iref1 flows between the drain and source of the second transistor 42.

The source (second current terminal) of the third transistor 43 is connected to the high potential 5 of the power supply, and the gate (control terminal) is connected to its own drain and the gate (control terminal) of the fourth transistor 44. The source (second current terminal) of the fourth transistor 44 is connected to the high potential 5 of the power supply, and the drain (first current terminal) is connected to the reference voltage generation circuit 50. Thus, the third transistor 43 and the fourth transistor 44 constitute a second current mirror circuit, and generate the adjusted current Iref3 that is proportional to the current Iref2 between the drain and source of the fourth transistor 44.

In this embodiment, the gate length and gate width of the first transistor 21 and the second transistor 42 are the same, and the gate length and gate width of the third transistor 43 and the fourth transistor 44 are the same.

The reference voltage generation circuit 50 has a fifth transistor 51, a sixth transistor 52, and a voltage division circuit 53. The fifth transistor 51 and the sixth transistor 52 are N-type MOSFETs.

The drain (first current terminal) of the fifth transistor 51 is connected to the drain of the fourth transistor 44 of the current adjusting circuit 40, and the source (second current terminal) is connected to the low potential 6 of the power supply. The gate (control terminal) of the fifth transistor 51 is connected to its own drain and the gate (control terminal) of the sixth transistor 52. The source (second current terminal) of the sixth transistor 52 is connected to the low potential 6 of the power supply. The voltage division circuit 53 is connected between the drain (first current terminal) of the sixth transistor 52 and the high potential 5 of the power supply. Thus, the fifth transistor 51 and the sixth transistor 52 constitute a third current mirror circuit, and a current Iref4 that is proportional to the adjusted current Iref3 is generated between the drain and source of the sixth transistor 52. In this embodiment, these transistors 51 and 52 have the same gate length and gate width.

The voltage division circuit 53 is made up of three resistors 54, 55, and 56 connected in series. The second reference voltage Vrefl is generated between the resistors 54 and 55, and the first reference voltage Vrefh is generated between the resistors 55 and 56. Therefore, the voltage differential between the first reference voltage Vrefh and the second reference voltage Vrefl is determined by the drop in voltage of the resistor 55.

Figure 10:
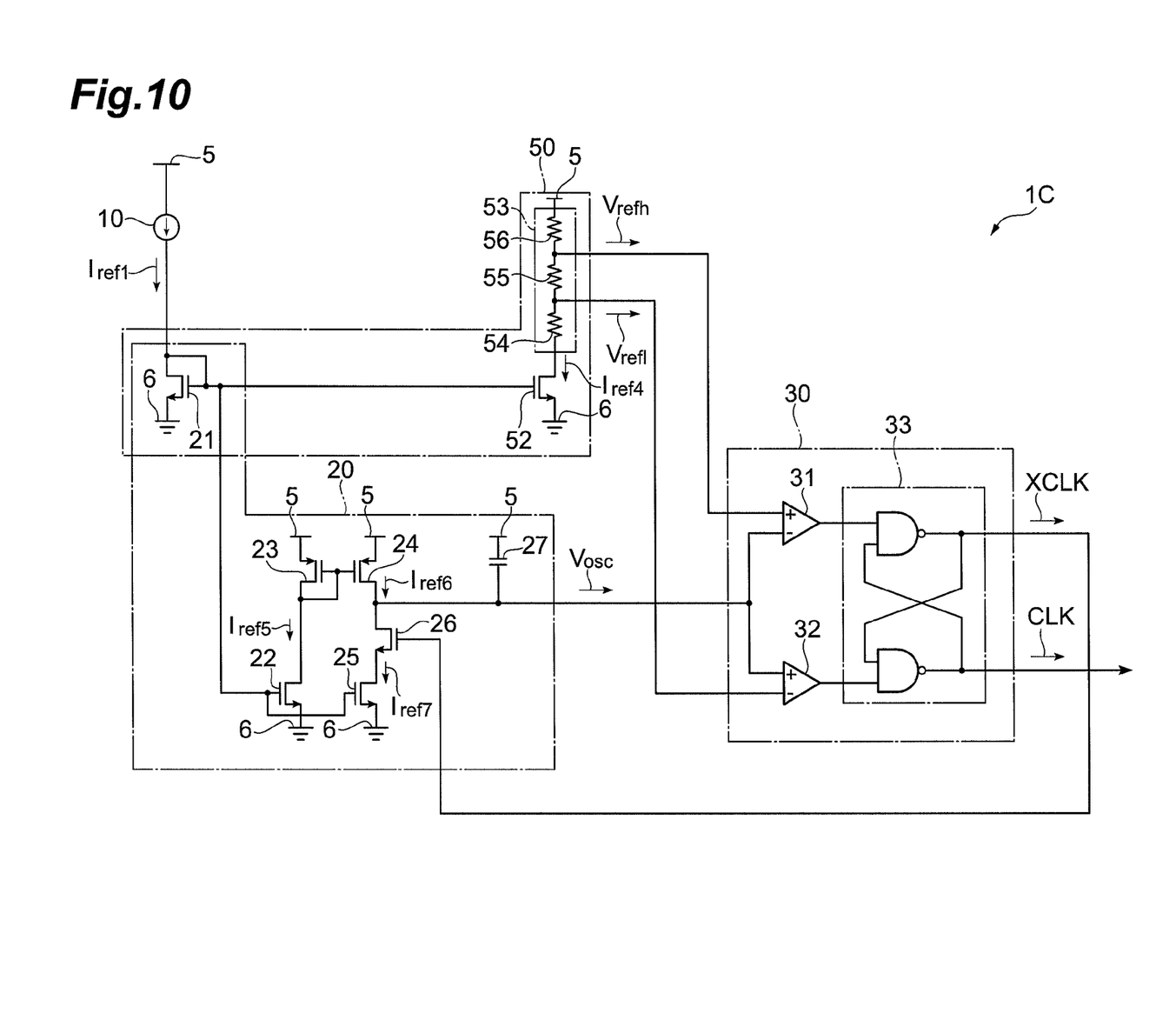
FIG. 10 is circuit diagram illustrating the oscillation circuit pertaining to a comparative example.

A comparative example of the oscillation circuit 1 will now be given. FIG. 10 is circuit diagram illustrating the oscillation circuit pertaining to a comparative example. The oscillation circuit 1C shown in FIG. 10 differs from the constitution of this embodiment in that it does not have the current adjusting circuit 40 that was provided to the oscillation circuit 1. More specifically, in the reference voltage generation circuit 50, the transistor 21 of the triangular wave generation circuit 20 is used instead of the fifth transistor 51.

Figure 3:
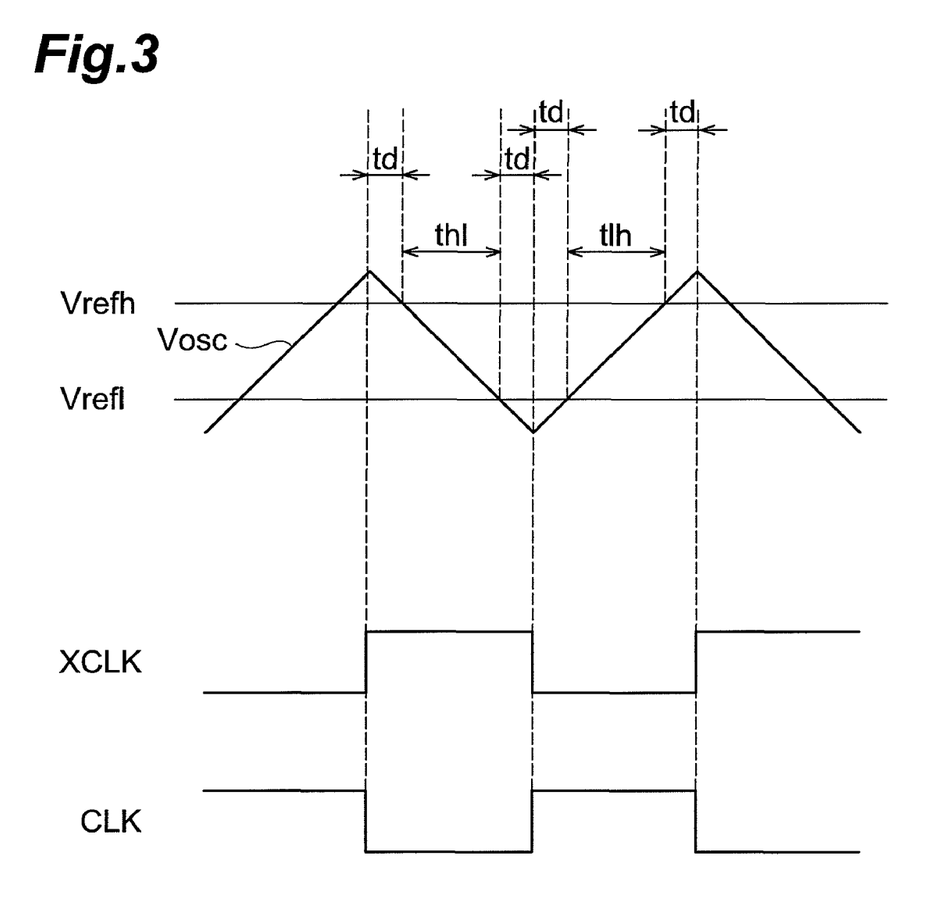
FIG. 3 is a diagram of the various signal waveforms shown in FIG. 1.

The operations of the oscillation circuits 1 and 1C will now be contrasted. FIG. 3 is a diagram of the various signal waveforms shown in FIGS. 1 and 10. When the clock signal XCLK is at a high level, the transistor 26 is on, the capacitor 27 is charged by the current differential Iref7-Iref6, or in other words, current equivalent to Iref1, and the voltage of the triangular wave signal Vosc gradually decreases. After this, when the voltage of the triangular wave signal Vosc reaches the second reference voltage Vrefl, the clock signal XCLK is switched to a low level after the response lag time of the comparison circuit 30, that is, the sum td of the response lag time of the comparator 31 or 32 and the response lag time of the SR-type latch circuit 33.

When this happens, the transistor 26 goes off, the capacitor 27 is discharged by the current Iref6, that is, the current equivalent to Iref1, and the voltage of the triangular wave signal Vosc gradually rises. After this, when the voltage of the triangular wave signal Vosc reaches the first reference voltage Vrefh, the clock signal XCLK is switched to a high level after the response lag time td of the comparison circuit 30. When this happens, the transistor 26 is switched on again, and the voltage of the triangular wave signal Vosc gradually decreases.

Figure 4:
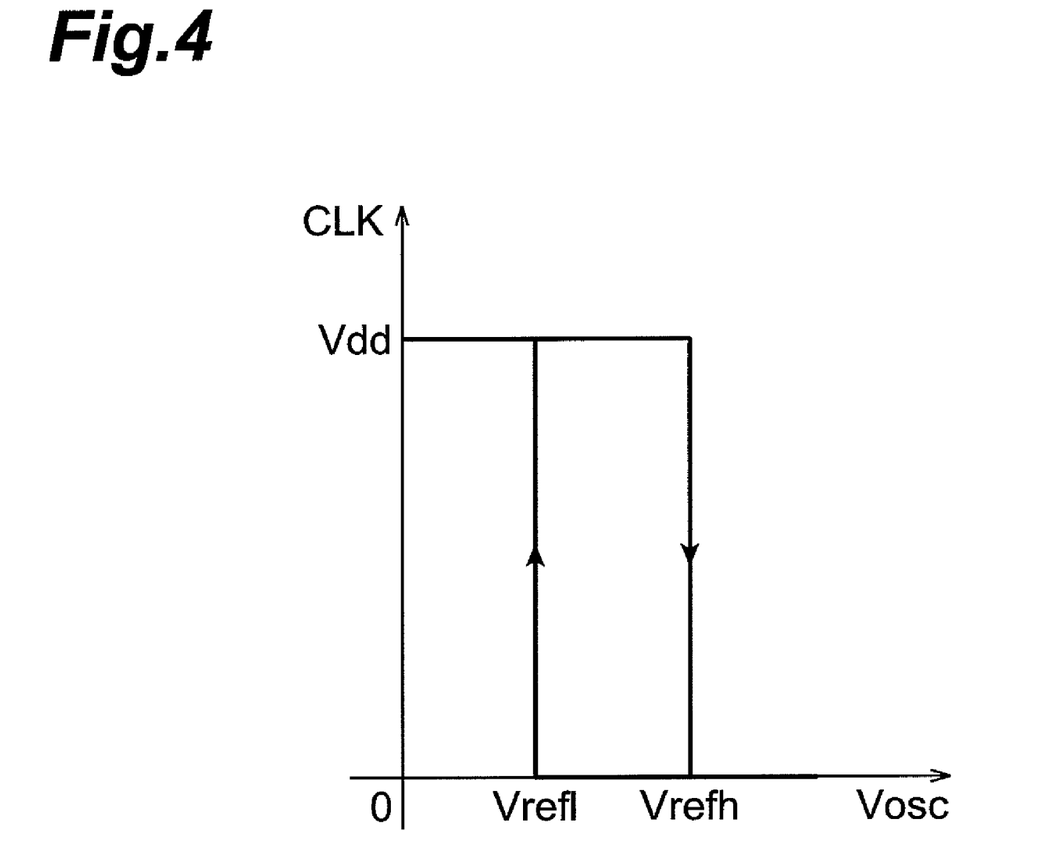
FIG. 4 is a graph of the hysteresis of a clock signal versus a triangular wave signal.

Thus, the charging and discharging of the capacitor 27 are repeated by feedback loop processing of the triangular wave generation circuit 20 and the comparison circuit 30, and the triangular wave signal Vosc and the clock signals CLK and XCLK are generated. This clock signal CLK has hysteresis with respect to the triangular wave signal Vosc because of the hysteresis function of the comparison circuit 30. FIG. 4 is a graph of the hysteresis of a clock signal versus a triangular wave signal.

Let us return to FIG. 3. As a result of feedback loop processing of the triangular wave generation circuit 20 and the comparison circuit 30, the repetition period of the triangular wave signal Vosc and the period of the clock signals CLK and XCLK substantially coincide, and the frequency f of the clock signals CLK and XCLK is determined by the following Formula 1.

$$f=1/(thl+tlh+4td) \quad (1)$$

thl: charging time of the capacitor 27 from the first reference voltage Vrefh to the second reference voltage Vrefl tlh: discharging time of the capacitor 27 from the second reference voltage Vrefl to the first reference voltage Vrefh td: response lag time of the comparison circuit 30

Figure 5:
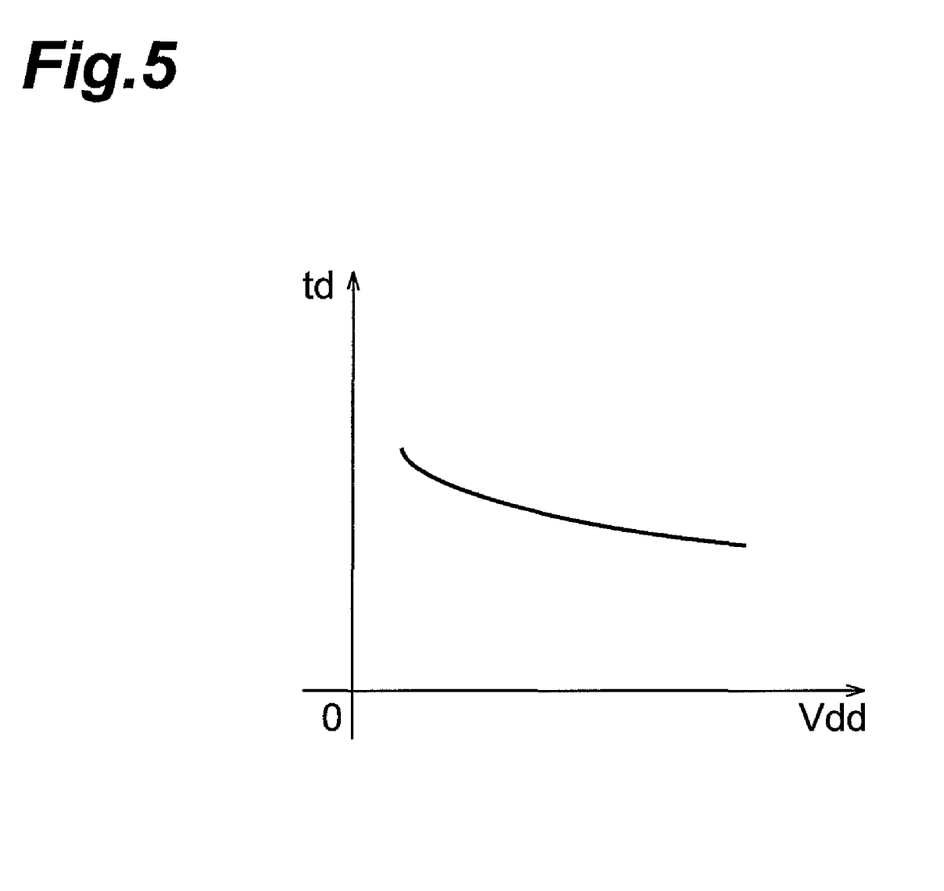
FIG. 5 is a graph of the response lag time versus the power supply voltage of a comparison circuit.

In general, the response lag time of a logic circuit is shorter the higher is the power supply voltage Vdd. FIG. 5 is a graph of the response lag time versus the power supply voltage of a comparison circuit including a logic circuit. As shown in FIG. 5, as the power supply voltage Vdd rises, the response lag time of the comparators 31 and 32 and the response lag time of the SR-type latch circuit 33 both grow shorter, so the response lag time td of the comparison circuit 30, which is determined by the sum of these, is also shorter. As a result, as is clear from FIG. 3 and the above-mentioned Formula 1, with the oscillation circuit 1C pertaining to a comparative example, the periods of the clock signals CLK and XCLK and the repeat period of the triangular wave signal Vosc are shorter, and the frequency f of the clock signals CLK and XCLK ends up being higher.

Figure 6:
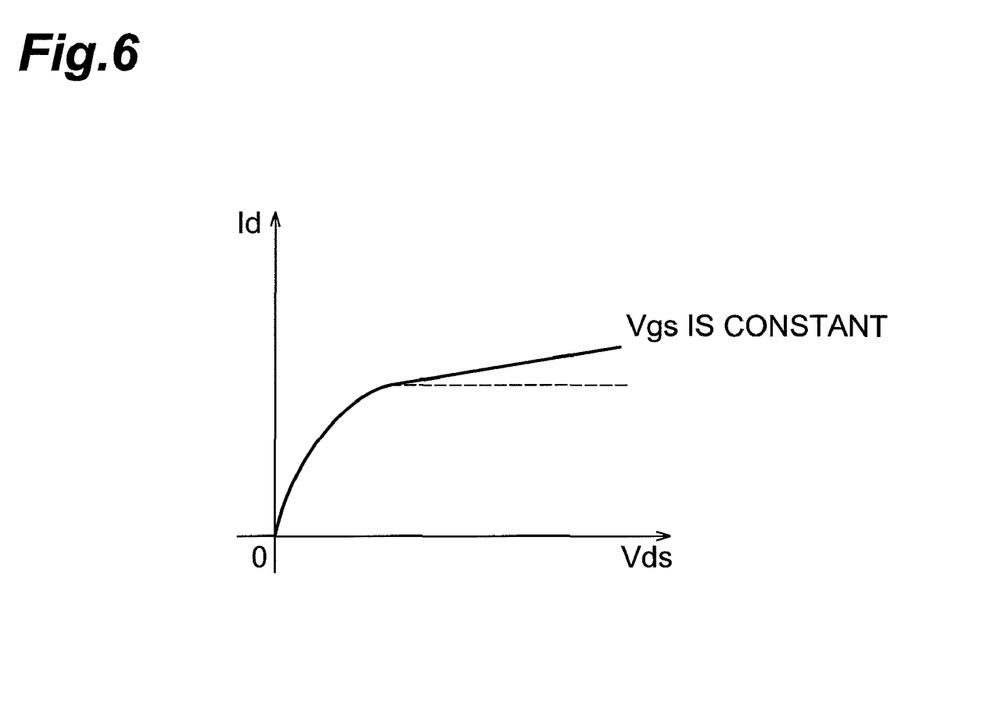
FIG. 6 is a graph of the drain current versus the drain-source voltage in a transistor.

However, with the current adjusting circuit 40 in this embodiment, as the power supply voltage Vdd rises, the voltage between the drain and source of the second transistor 42 increases. In general, with a transistor, drain current varies according to the voltage between the drain and source. FIG. 6 is a graph of the drain current versus the drain-source voltage in a transistor. As shown in FIG. 6, even if the gate voltage Vgs is constant and large enough for operation to be possible in the saturation region, as the drain-source voltage Vds rises, it can be seen that the drain current Id increases. Furthermore, the increase in the drain current Id versus the drain-source voltage Vds can be adjusted by modifying the gate length.

Therefore, even if the current Iref1 from the reference current source is constant, if the power supply voltage Vdd rises, most of the current Iref2 will flow between the drain and source of the second transistor 42, and there will be a corresponding increase in the adjusted current Iref3 and in the current Iref4 that flows the voltage division circuit 53 of the reference voltage generation circuit 50. As a result, the drop in voltage of the resistor 55 will increase, and the voltage differential Vrefh-Vrefl between the first reference voltage Vrefh and the second reference voltage Vrefl will be greater.

On the other hand, if the power supply voltage Vdd drops, there will be less current Iref2 flowing to the second transistor 42, which will reduce the adjusted current Iref3 and the current Iref4 flowing to the voltage division circuit 53, so the drop in voltage of the resistor 55 will decrease, and the voltage differential Vrefh−Vrefl between the first reference voltage Vrefh and the second reference voltage Vrefl will be smaller.

Figure 7:
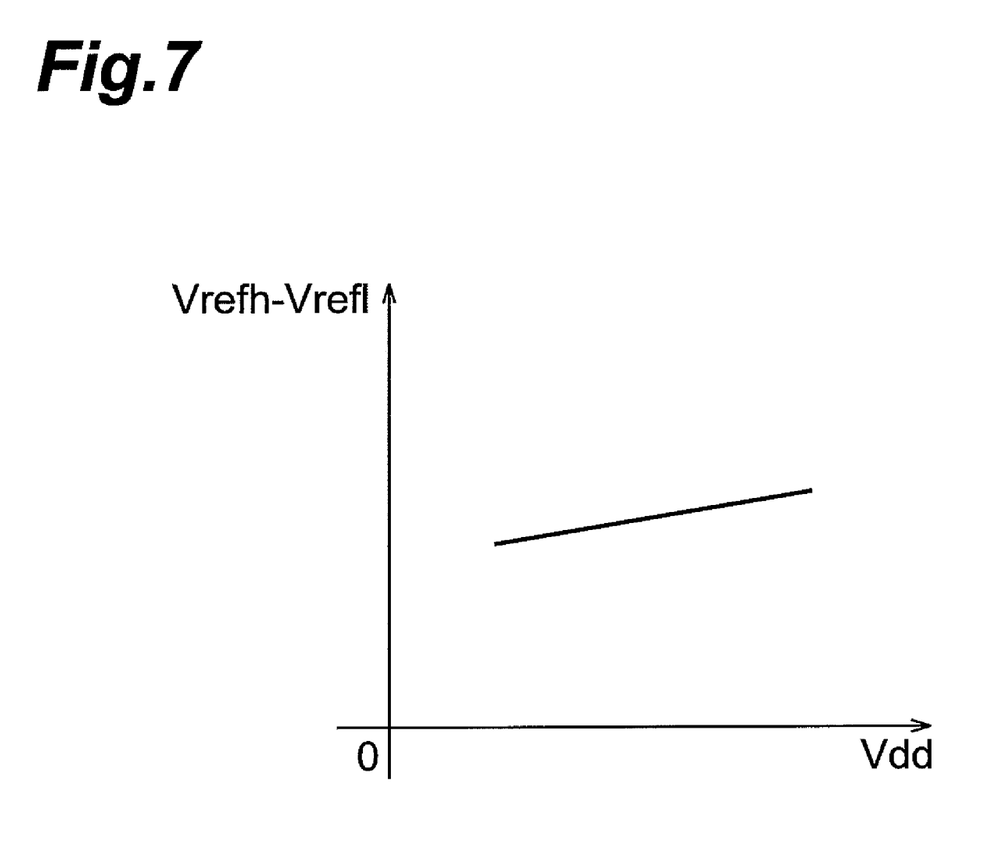
FIG. 7 is a graph of the voltage differential between the first reference voltage and the second reference voltage versus the power supply voltage.

FIG. 7 is a graph of the voltage differential between the first reference voltage and the second reference voltage versus the power supply voltage. It can be seen in FIG. 7 that as the power supply voltage Vdd rises, the voltage differential Vrefh−Vrefl between the first reference voltage Vrefh and the second reference voltage Vrefl becomes larger.

As is clear from FIG. 3, when the voltage differential Vrefh−Vrefl becomes larger, the charging time thl and discharging time tlh of the capacitor 27 become longer. On the other hand, when the voltage differential Vrefh−Vrefl becomes smaller, the charging time thl and discharging time tlh of the capacitor 27 become shorter.

Thus, with the oscillation circuit 1 in this embodiment, when the power supply voltage Vdd rises and the response lag time td of the comparison circuit 30 is shorter, the current adjusting circuit 40 increases the value of the adjusted current Iref3, and the reference voltage generation circuit 50 increases the voltage differential between the first reference voltage Vrefh and the second reference voltage Vrefl, so the charging time thl and discharging time tlh of the capacitor 27 become longer. On the other hand, when the power supply voltage Vdd drops and the response lag time td of the comparison circuit 30 is longer, the current adjusting circuit 40 reduces the value of the adjusted current Iref3, and the reference voltage generation circuit 50 decreases the voltage differential between the first reference voltage Vrefh and the second reference voltage Vrefl, so the charging time thl and discharging time tlh of the capacitor 27 become shorter. Therefore, with this oscillation circuit 1, even fluctuation in the power supply voltage Vdd should cause fluctuation in the response lag time td of the comparison circuit 30, the charging time thl and discharging time tlh of the capacitor 27 are changed so as to cancel out this change in the response lag time td, and this allows fluctuation in the frequency of the clock signal CLK to be reduced. Consequently, fluctuation in the frequency of the clock signal CLK attributable to the power supply voltage dependence of the comparison circuit 30 can be reduced.

Also, the oscillation circuit 1 in this embodiment has a constitution that is not dependent on the reference current Iref1. Specifically, the oscillation circuit 1 is designed so that even if the reference current Iref1 fluctuates, the frequency of the clock signals CLK and XCLK can be kept constant. The charging time thl and discharging time tlh of the capacitor 27 are expressed by the following Formula 2.

$$thl = (Vrefh - Vrefl) \times C/(Iref7 - Iref6)$$

$$tlh = (Vrefh - Vrefl) \times C/Iref6$$

Here, the voltage differential (Vrefh−Vrefl) is the amount of drop in the voltage of the resistor 55, and is determined by the resistance of the resistor 55 and the value of the current Iref4.

The current Iref4, the current (Iref7−Iref6), and the current Iref6 are proportional to the reference current Iref1. Therefore, fluctuation in the current (Iref7−Iref6) and the current Iref6 attributable to fluctuation in the reference current Iref1 can be canceled out by fluctuation in the current Iref4 attributable to fluctuation in the reference current Iref1. As a result, even if the reference current Iref1 fluctuates, the charging time thl and discharging time tlh of the capacitor 27 can be kept constant, and the frequency of the clock signals CLK and XCLK can also be kept constant.

The effect of reducing the power supply voltage dependence of the response lag time td of the comparison circuit 30 was described above, but with the oscillation circuit 1 of this embodiment, it is also possible to reduce the temperature dependence of the response lag time td of the comparison circuit 30. Specifically, when the temperature of a logic circuit rises, the response lag time td is generally reduced, but since the transistors of the current adjusting circuit 40 reduce current when the temperature rises, the voltage differential Vrefh−Vrefl becomes smaller, and the charging time thl and discharging time tlh of the capacitor 27 become shorter so as to cancel out the change in the response lag time td. For example, the temperature dependence of the response lag time td of the comparison circuit 30 is found ahead of time by experimentation or simulation, and this temperature dependence is taken into account in adjusting the gate length of the transistors 42, 43, and 44 of the current adjusting circuit 40, and in adjusting the amount of change in the adjusted current Iref3.

Also, with the oscillation circuit 1 in this embodiment, it is possible to reduce the power supply voltage dependence of the triangular wave generation circuit 20. With the triangular wave generation circuit 20, the transistors 21 and 22 and the transistors 21 and 25 each constitute a current mirror circuit, and have power supply voltage dependence. Therefore, as the current Iref5 and the current Iref6 fluctuate, the current Iref7 fluctuates along with them, the charging time thl and discharging time tlh of the capacitor 27 fluctuate, and the frequency of the clock signals CLK and XCLK ends up fluctuating. In view of this, the power supply voltage dependence of the charging time thl and discharging time tlh of the capacitor 27 in the triangular wave generation circuit 20 is found, and this power supply voltage dependence is taken into account in adjusting the gate length of the transistors 42, 43, and 44 of the current adjusting circuit 40, and in adjusting the amount of change in the adjusted current Iref3.

As integrated circuitry has become smaller in recent years, the operating frequency of the circuits has tended to rise. Accordingly, the oscillation frequency needed for an oscillation circuit has also tended to rise. With a simple and inexpensive oscillation circuit as in this embodiment, the repeat frequency of the triangular wave signal can be adjusted relatively freely by adjusting the analog current amount in the triangular wave generation circuit, for example, but it is difficult to shorten the response lag time of the comparison circuit beyond a certain point. Therefore, the higher is the oscillation frequency, the greater is the proportion that power supply voltage dependence of the response lag time of the comparison circuit accounts for in the power supply voltage dependence of the oscillation frequency. With the oscillation circuit 1 in this embodiment, even if the oscillation frequency is raised, the power supply voltage dependence of the oscillation frequency can be reduced by a simple method.

Furthermore, the present invention is not limited to this embodiment, and various modifications are possible.

Figure 8:
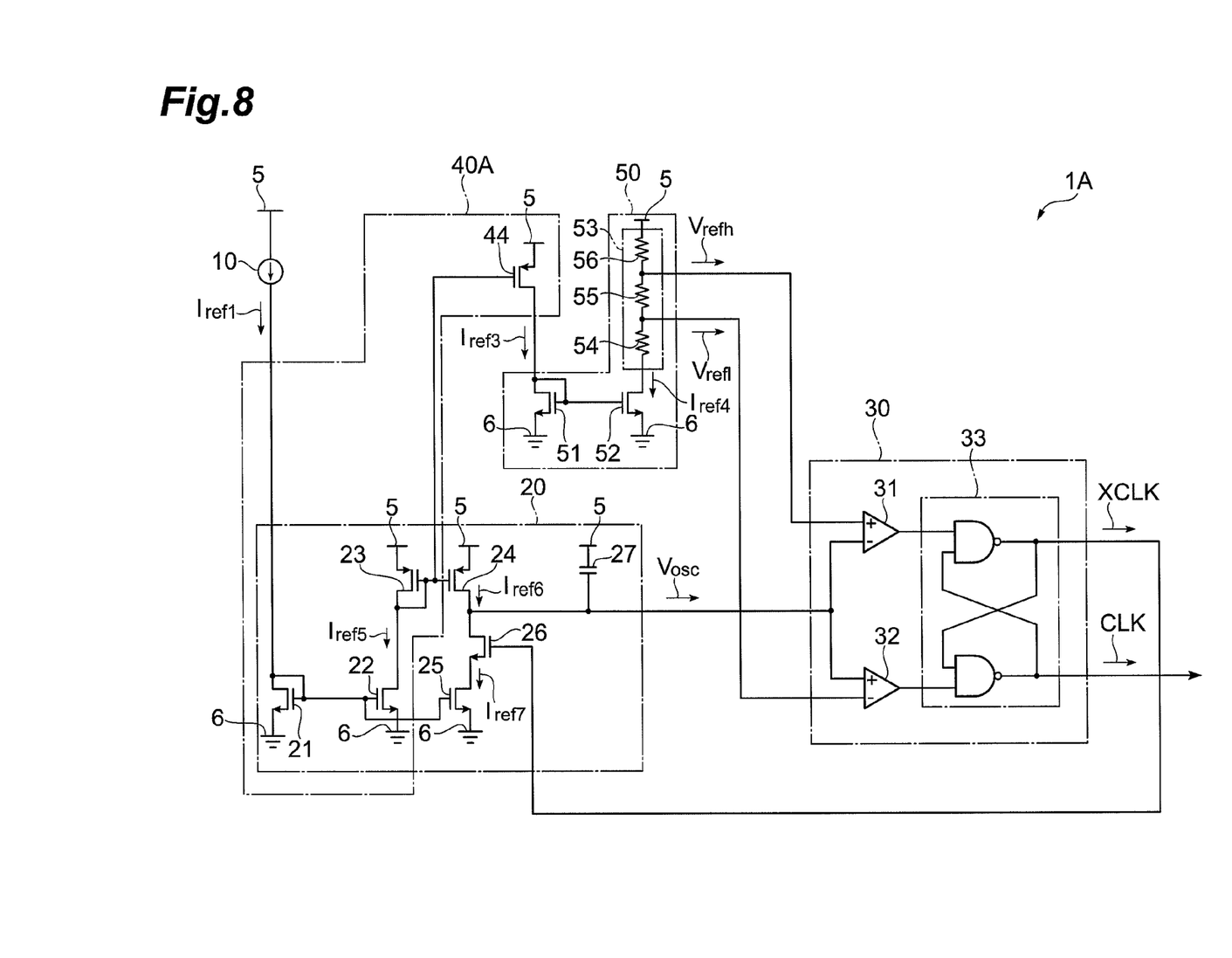
FIG. 8 is circuit diagram illustrating the oscillation circuit pertaining to Modification Example 1.

In this embodiment, the current adjusting circuit 40 shared the first transistor 21 with the triangular wave generation circuit 20, but may also share the second transistor and third transistor with the triangular wave generation circuit 20. FIG. 8 is circuit diagram illustrating the oscillation circuit pertaining to Modification Example 1. The oscillation circuit 1A shown in FIG. 8 differs from the oscillation circuit 1 in that it comprises a current adjusting circuit 40A instead of the current adjusting circuit 40 used in the oscillation circuit 1. The current adjusting circuit 40A comprises transistors 22 and 23 as a first transistor and second transistor, respectively, instead of the second transistor 42 and the third transistor 43 used in the current adjusting circuit 40. Specifically, the current adjusting circuit 40A shares the first transistor 21, the second transistor 22, and the third transistor 23 with the triangular wave generation circuit 20. The oscillation circuit 1A in this Modification Example 1 has the same advantages as the oscillation circuit 1, but also allows the circuit size to be reduced and power consumption to be lowered.

Figure 9:
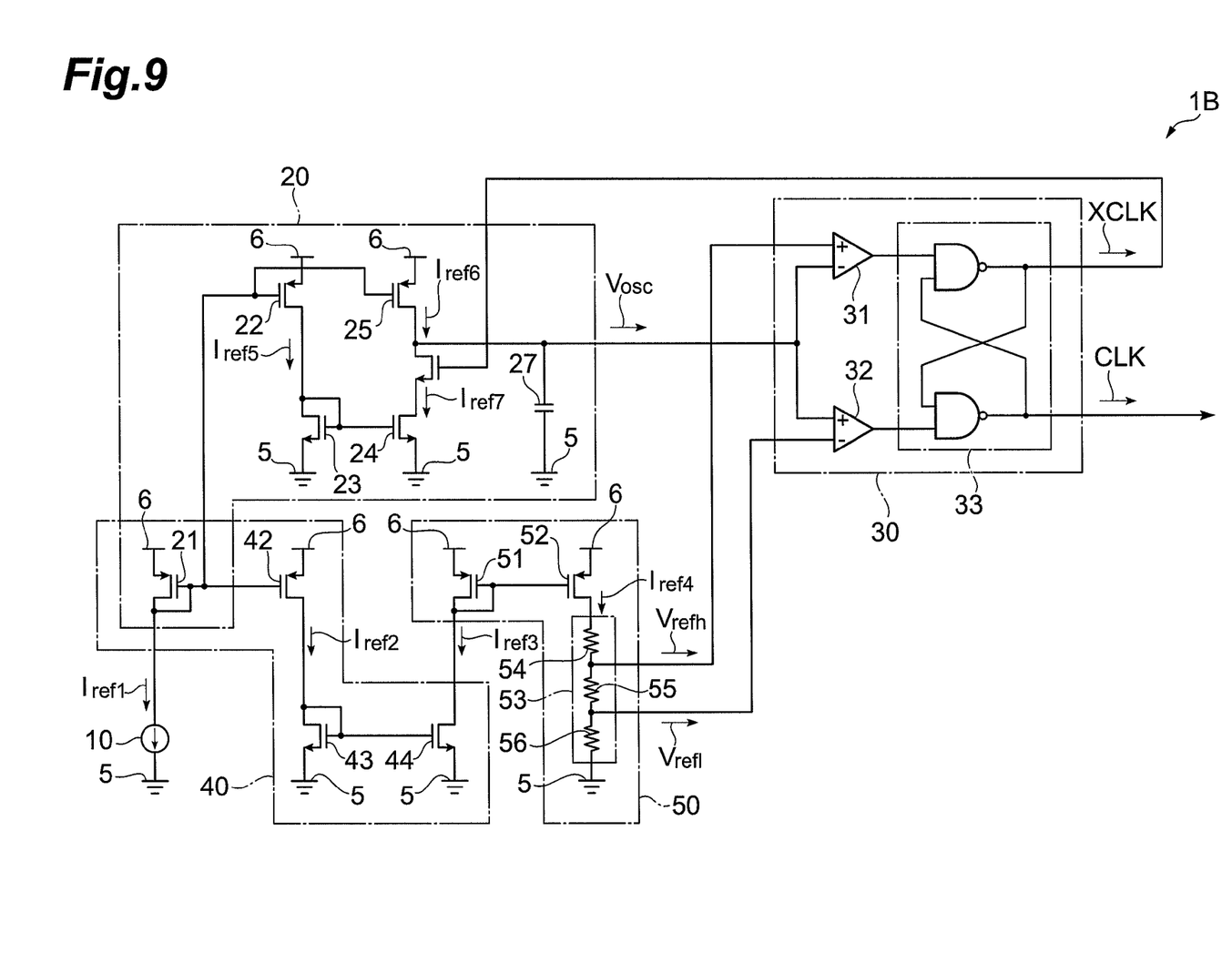
FIG. 9 is circuit diagram illustrating the oscillation circuit pertaining to Modification Example 2.

With the above embodiment and Modification Example 1, P-type MOSFETs may be used in place of N-type MOSFETs, and N-type MOSFETs may be used in place of P-type MOSFETs. FIG. 9 is circuit diagram illustrating the oscillation circuit pertaining to Modification Example 2. With the oscillation circuit 1B shown in FIG. 9, the transistors 21, 22, 25, 42, 51, and 52 used in the oscillation circuit 1 are changed from N-type MOSFETs to P-type MOSFETs, and the transistors 23, 24, 43, and 44 are changed from P-type MOSFETs to N-type MOSFETs.

Also, with the oscillation circuit 1 the one potential 6 of the power supply was a low potential and the other potential 5 was a high potential, but with the oscillation circuit 1B, the one potential 6 of the power supply is a high potential and the other potential 5 is a low potential. Also, with the oscillation circuit 1 the first reference voltage Vrefh was generated between the resistor 55 and the resistor 56, and the second reference voltage Vrefl was generated between the resistor 54 and the resistor 55, but with the oscillation circuit 1B, the second reference voltage Vrefl is generated between the resistor 55 and the resistor 56, and the first reference voltage Vrefh is generated between the resistor 54 and the resistor 55.

With the oscillation circuit 1B, unlike the oscillation circuit 1, the time tlh in FIG. 3 is the charging time of the capacitor 27, and the time thl is the discharging time of the capacitor 27, but rest of the operation is the same as that of the oscillation circuit 1, and the same advantages are obtained as with the oscillation circuit 1.

Also, MOSFETs were used as the transistors in the above embodiment and modification example, but bipolar transistors may be used instead.

Also, to simplify the explanation, the gate length and gate width were stated to be the same for the transistor 51 and the transistor 52 in the reference voltage generation circuit 50 and for the transistors 21, 42, 43, and 44 in the current adjusting circuit 40 in the above embodiment and modification example, but they may instead be different.

Similarly, in the above embodiment and modification example, to simplify the explanation, the gate length and gate width were the same for the transistor 21 and the transistor 22 in the triangular wave generation circuit 20, the gate length and gate width were the same for the transistor 23 and the transistor 24, the gate length was the same for the transistor 25 and the transistor 21, and the gate width of the 25 was stated to be twice that of the transistor 21, but as long as the current ratio is 1:2 between the current Iref6 and the current Iref7, the transistors 21, 22, 23, 24 and 25 may have different gate lengths and gate widths from those in the above embodiment.

Also, in the above embodiment and modification example, the current adjusting circuit 40 was made up of a two-stage current mirror circuit, but may instead be made up of 2N stages of current mirror circuit (where N is an integer of 1 or greater), according to the length of the response lag time td of the comparison circuit 30. Using a current mirror circuit of 2N stages allows the magnitude of the change to the current Iref4 versus the change in power supply voltage to be multiplied by N times. The number of stages is determined so as to cancel out the lag time versus the change in the power supply voltage of the comparison circuit.

Also, in the above embodiment and modification example, an integrated circuit was assumed, and a single power supply voltage was supplied to all the circuits of the oscillation circuit 1, but at the very least the power supply voltage of the comparison circuit 30 and the power supply voltage of the current adjusting circuit 40 may be the same, and the same advantages as with the oscillation circuit 1 will be obtained if different power supply voltages are supplied to the other circuits 10, 20, and 50.

Also, in the above embodiment and modification example, the voltage division circuit 53 of the reference voltage generation circuit 50 was made up of the three resistors 54, 55, and 56, but the voltage division circuit 53 may be made up of a plurality of resistors connected in series, and the voltage differential between the first reference voltage Vrefh and the second reference voltage Vrefl may be determined by the sum of the drop in voltage of the plurality of resistors.

Also, the reference current source 10 was provided in the above embodiment and modification example, but the oscillation circuit 1 and 1A need not comprise the reference current source 10, and may be connected to a reference current source formed on the outside of an integrated circuit.

Also, in the above embodiment, the capacitor 27 was connected between the high potential 5 of the power supply and the drain of the transistors 24 and 26, but may instead be connected between the low potential 6 of the power supply and the drain of the transistors 24 and 26. Similarly, in the above modification example, the capacitor 27 was connected between the high potential 5 of the power supply and the drain of the transistors 25 and 26, but may instead be connected between the low potential 6 of the power supply and the drain of the transistors 25 and 26.

Also, in the above embodiment, the transistor 26 was connected between the capacitor 27 and the transistor 25, but may instead be connected between the transistor 24 and the capacitor 27. In this case, the transistor 26 is changed to a P-type MOSFET, and the gate length and gate width of the transistors 21, 22, 23, 24, and 25 are each changed so that the current Iref6 will be twice the current Iref7. Similarly, in the above modification example, the transistor 26 was connected between the capacitor 27 and the transistor 24, but may instead be connected between the transistor 25 and the capacitor 27. In this case, the transistor 26 is changed to a P-type MOSFET, and the gate length and gate width of the transistors 21, 22, 23, 24, and 25 are each changed so that the current Iref6 will be twice the current Iref7.

Also, in the above embodiment, the clock signal XCLK was received from the comparison circuit 30, and the switch that switched the capacitor 27 between charging and discharging was constituted by the transistor 26 that was an N-type MOSFET, but this switch may instead be constituted by a P-type MOSFET and an N-type MOSFET that are connected in series. More specifically, this configuration would be achieved by adding to the above embodiment a P-type MOSFET in which the source is connected to the drain of the transistor 24 and the transistor 26, the drain is connected to the capacitor 27 and the drain of the transistor 26, and the clock signal XCLK is inputted to the gate. If the switch is made up of a P-type MOSFET and an N-type MOSFET that are connected in series, this suppresses the amount of current flowing through this switch from the high potential 5 to the low potential 6, and allows power consumption to be reduced.

INDUSTRIAL APPLICABILITY

The present invention the present invention[1] can be utilized in an oscillation circuit.

The invention claimed is:

1. An oscillation circuit for generating a clock signal with a rectangular waveform, comprising:
    a triangular wave generation circuit that includes a capacitor, switches the charging or discharging state of the capacitor according to the voltage value of the clock signal, and generates a triangular wave signal;
    a comparison circuit that receives the triangular wave signal outputted from the triangular wave generation circuit, receives a first reference voltage and a second reference voltage, and generates the clock signal having a voltage value that corresponds to a comparison of the voltage value of the triangular wave signal with the value of the first reference voltage, and to a comparison of the voltage value of the triangular wave signal with the value of the second reference voltage;
    a current adjusting circuit that is connected to a reference current source outputting a reference current, is connected to a power supply for the comparison circuit, and generates an adjusted current in which the value of the reference current has been changed according to the change in voltage of the power supply; and
    a reference voltage generation circuit that generates the first reference voltage and the second reference voltage having a voltage differential that corresponds to the value of the adjusted current outputted from the current adjusting circuit,
    wherein the current adjusting circuit increases the adjusted current when the voltage of the power supply for the comparison circuit rises, and reduces the adjusted current when the voltage of the power supply drops, and
    the reference voltage generation circuit increases the voltage differential between the first reference voltage and the second reference voltage when the adjusted current increases, and reduces the voltage differential between the first reference voltage and the second reference voltage when the adjusted current decreases.

2. The oscillation circuit according to claim 1,
    wherein the current adjusting circuit has:
    a first current mirror circuit to which the reference current is inputted; and
    a second current mirror circuit to which the output current of the first current mirror circuit is inputted and which receives a supply of voltage from the power supply,
    and the output current of the second current mirror circuit is outputted as the adjusted current.

3. The oscillation circuit according to claim 1,
    wherein the reference voltage generation circuit has:
    a current mirror circuit to which the adjusted current is inputted; and
    a voltage division circuit to which the output current of the current mirror circuit flows,
    and the voltage division circuit includes a plurality of resistors connected to each other in series, and generates the first reference voltage and the second reference voltage of which voltage differential is the drop in voltage of at least one of the plurality of resistors.

4. The oscillation circuit according to claim 2,
    wherein the reference voltage generation circuit has:
    a third current mirror circuit to which the adjusted current is inputted; and
    a voltage division circuit to which the output current of the third current mirror circuit flows,
    and the voltage division circuit includes a plurality of resistors connected to each other in series, and generates the first reference voltage and the second reference voltage of which voltage differential is the drop in voltage of at least one of the plurality of resistors.

5. The oscillation circuit according to claim 2,
    wherein the first current mirror circuit of the current adjusting circuit has:
    a first transistor having a first current terminal connected to the reference current source, a second current terminal connected to one potential of the power supply, and a control terminal connected to the first current terminal; and
    a second transistor having a control terminal connected to the control terminal of the first transistor, a first current terminal, and a second current terminal connected to one potential of the power supply,
    and the second current mirror circuit of the current adjusting circuit has:
    a third transistor having a first current terminal connected to the first current terminal of the second transistor, a second current terminal connected to the other potential of the power supply, and a control terminal connected to the first current terminal; and
    a fourth transistor having a control terminal connected to the control terminal of the third transistor, a first current terminal, and a second current terminal connected to the other potential of the power supply.

6. The oscillation circuit according to claim 3,
    wherein the current mirror circuit of the reference voltage generation circuit has:
    a first transistor having a first current terminal connected to the current adjusting circuit, a second current terminal connected to one potential of the power supply, and a control terminal connected to the first current terminal; and
    a second transistor having a control terminal connected to the control terminal of the first transistor, a first current terminal, and a second current terminal connected to one potential of the power supply,
    and the voltage division circuit of the reference voltage generation circuit is connected between the first current terminal of the second transistor and the other potential of the power supply.

7. The oscillation circuit according to claim 4,
    wherein the third current mirror circuit of the reference voltage generation circuit has:
    a first transistor having a first current terminal connected to the current adjusting circuit, a second current terminal connected to one potential of the power supply, and a control terminal connected to the first current terminal; and
    a second transistor having a control terminal connected to the control terminal of the first transistor, a first current terminal, and a second current terminal connected to one potential of the power supply,
    and the voltage division circuit of the reference voltage generation circuit is connected between the first current terminal of the second transistor and the other potential of the power supply.

* * * * *